US010950789B2

(12) United States Patent
Wu et al.

(10) Patent No.: US 10,950,789 B2
(45) Date of Patent: Mar. 16, 2021

(54) RESISTIVE RANDOM ACCESS MEMORY STRUCTURE AND METHOD FOR FORMING THE SAME

(71) Applicant: Winbond Electronics Corp., Taichung (TW)

(72) Inventors: Bo-Lun Wu, Tianzhong Township, Changhua County (TW); Yi-Hsiu Chen, Zhubei (TW); Ting-Ying Shen, Chiayi (TW); Po-Yen Hsu, New Taipei (TW)

(73) Assignee: WINBOND ELECTRONICS CORP., Taichung (TW)

( * ) Notice: Subject to any disclaimer, the term of this patent is extended or adjusted under 35 U.S.C. 154(b) by 63 days.

(21) Appl. No.: 16/428,292

(22) Filed: May 31, 2019

(65) Prior Publication Data

US 2020/0381620 A1 Dec. 3, 2020

(51) Int. Cl.
*H01L 45/00* (2006.01)
*H01L 27/24* (2006.01)

(52) U.S. Cl.
CPC ...... *H01L 45/1253* (2013.01); *H01L 27/2436* (2013.01); *H01L 27/2463* (2013.01); *H01L 45/08* (2013.01); *H01L 45/1233* (2013.01); *H01L 45/146* (2013.01); *H01L 45/1683* (2013.01)

(58) Field of Classification Search
CPC ............. H01L 45/1253; H01L 45/1233; H01L 27/2436; H01L 45/1683; H01L 45/146; H01L 45/08; H01L 27/2463
See application file for complete search history.

(56) References Cited

U.S. PATENT DOCUMENTS

| 8,023,299 | B1 | 9/2011 | Gharia |
| 9,087,572 | B2 | 7/2015 | Sekar et al. |
| 9,257,641 | B2 | 2/2016 | Chen et al. |
| 9,454,997 | B2 * | 9/2016 | Liu ........................ H01L 27/101 |
| 2009/0230512 | A1 * | 9/2009 | Baek ..................... H01L 27/249 |
| | | | 257/536 |

FOREIGN PATENT DOCUMENTS

TW  201001694 A  1/2010

* cited by examiner

*Primary Examiner* — Karen Kusumakar
(74) *Attorney, Agent, or Firm* — Muncy, Geissler, Olds and Lowe, P.C.

(57) ABSTRACT

A resistive random access memory structure includes a semiconductor substrate, a transistor, a bottom electrode, a plurality of top electrodes, and a resistive-switching layer. The transistor is disposed over the semiconductor substrate. The bottom electrode is disposed over the semiconductor substrate and is electrically connected to a drain region of the transistor. The plurality of top electrodes is disposed along a sidewall of the bottom electrode. The resistance-switching layer is disposed between the bottom electrode and the plurality of top electrodes.

20 Claims, 18 Drawing Sheets

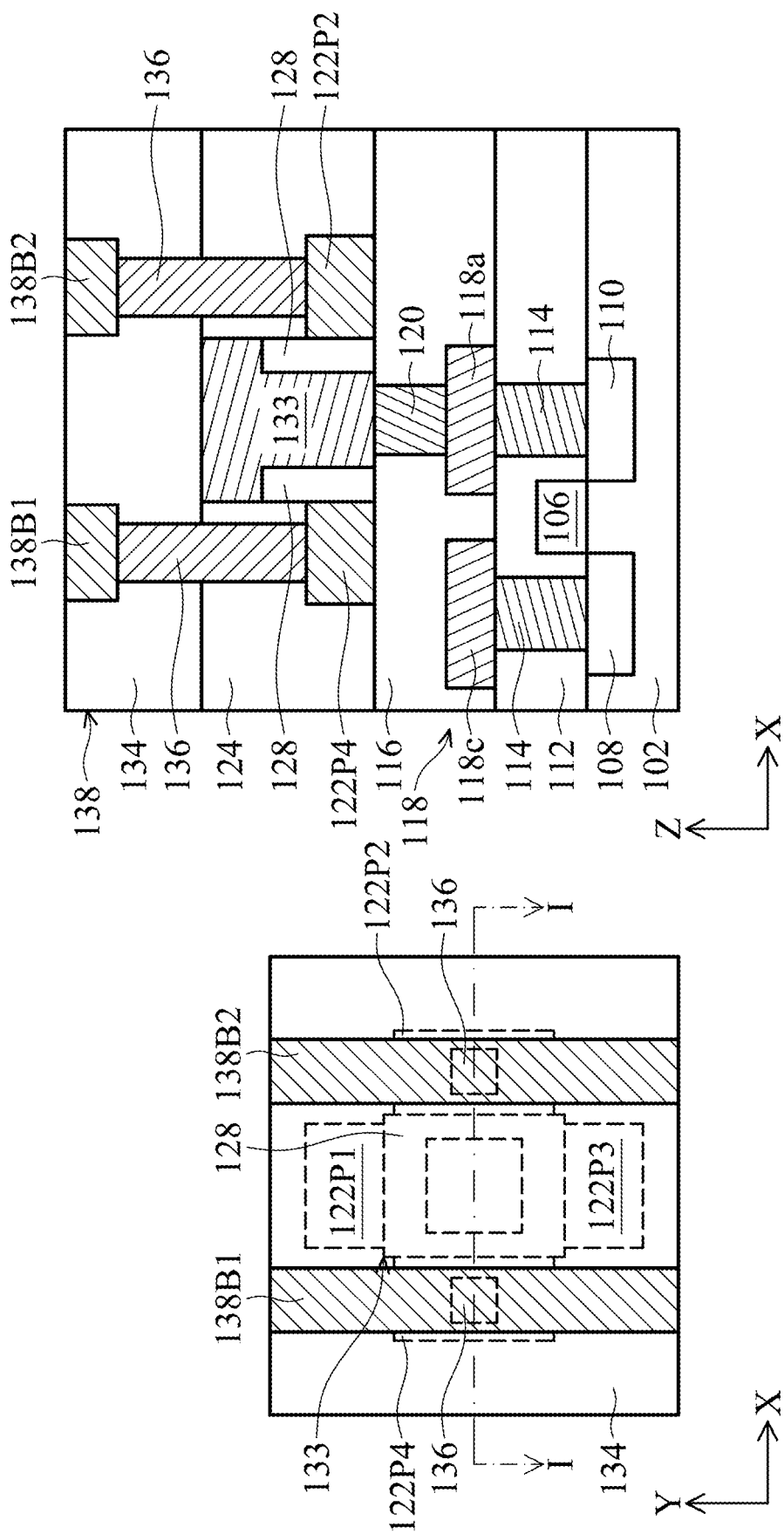

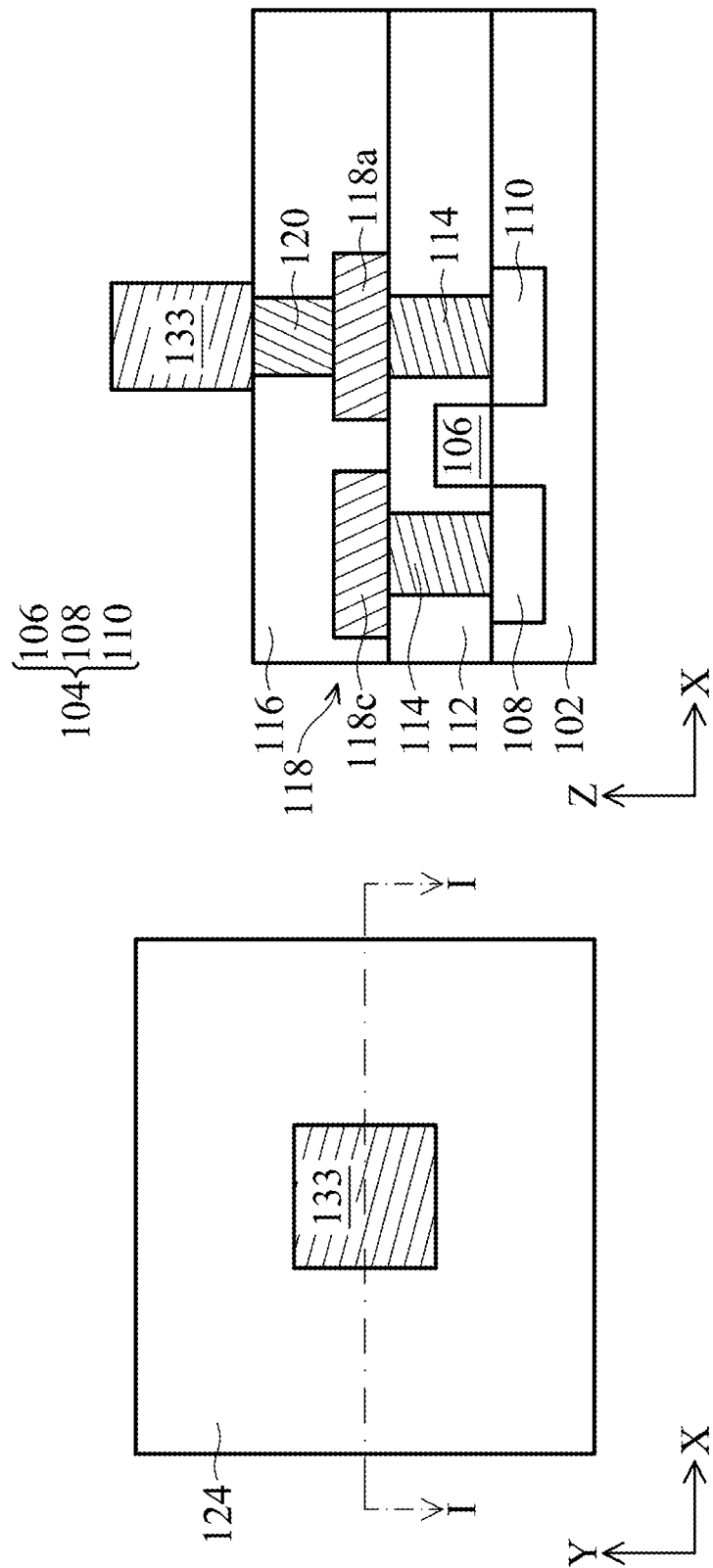

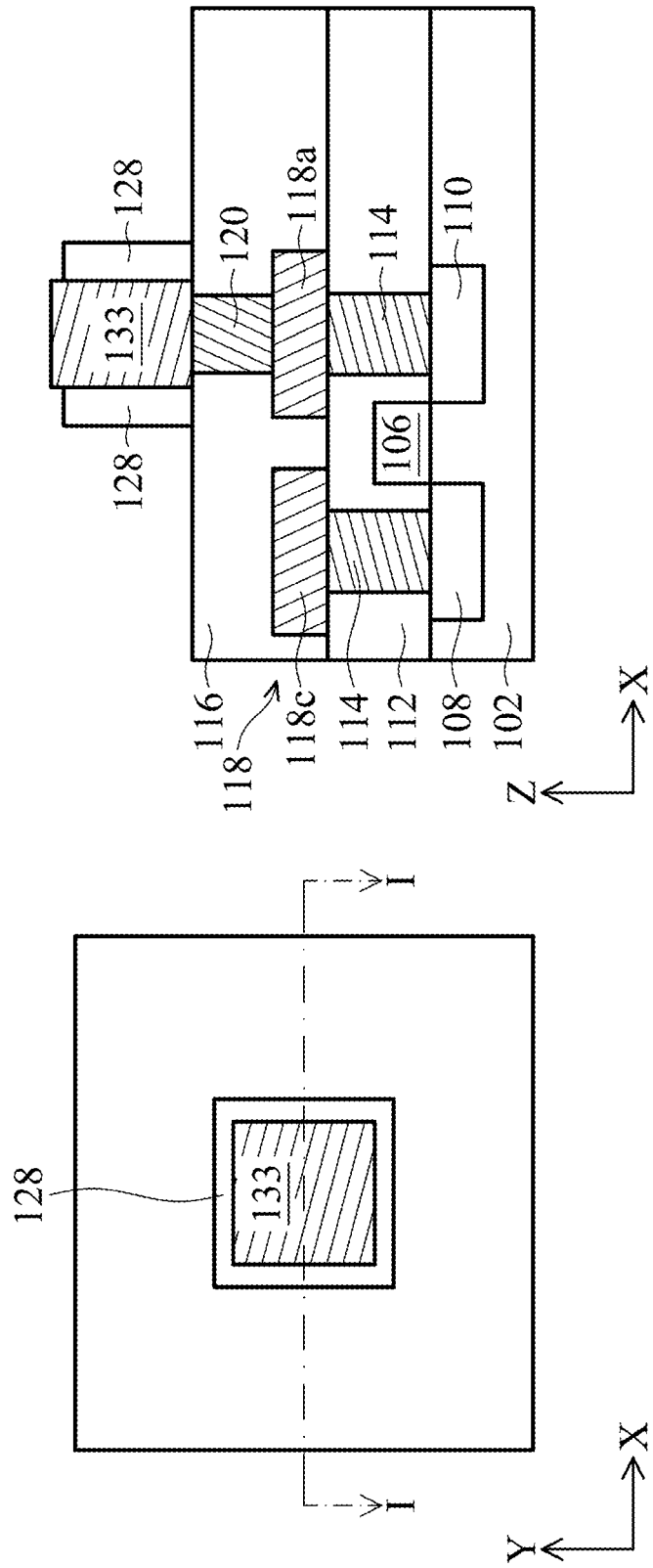

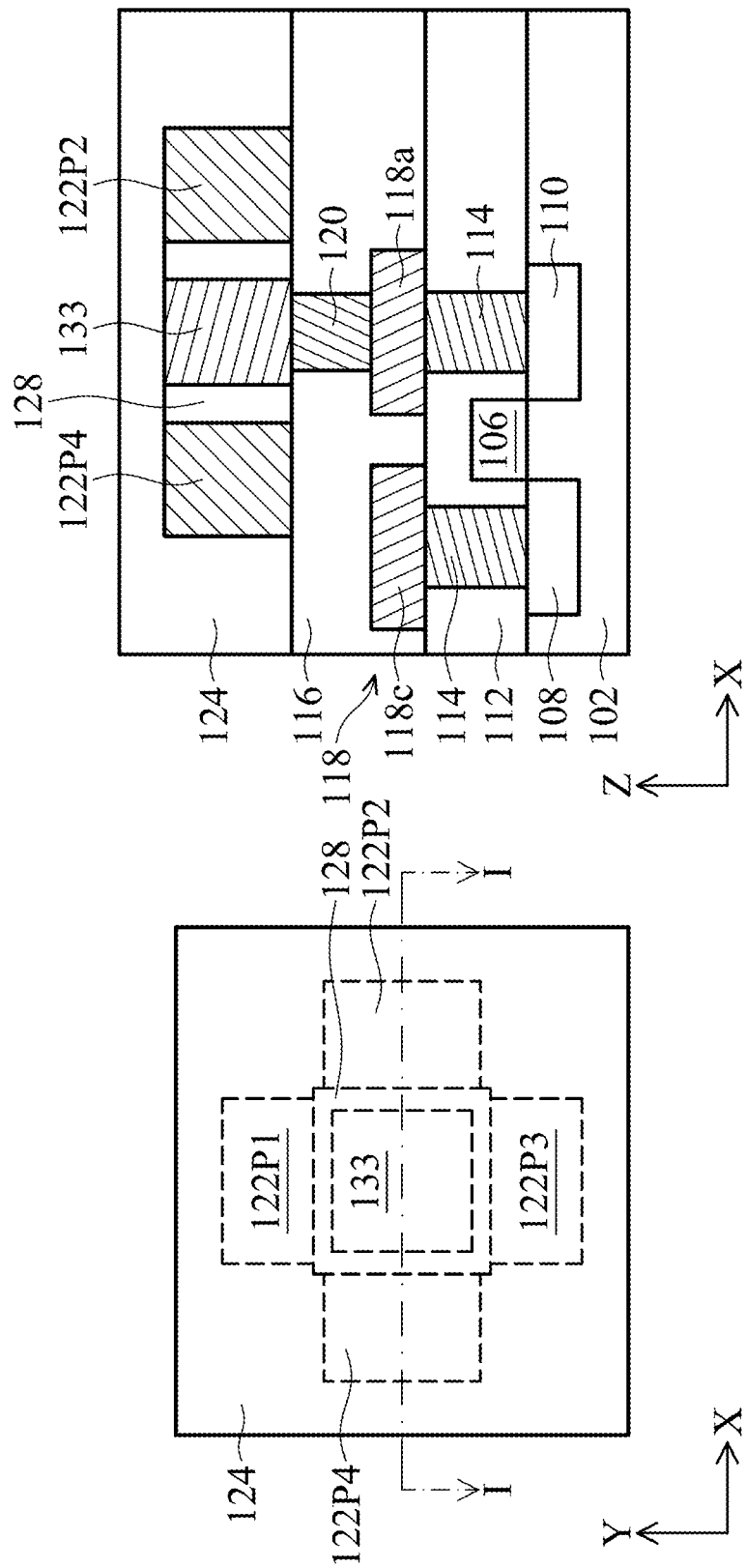

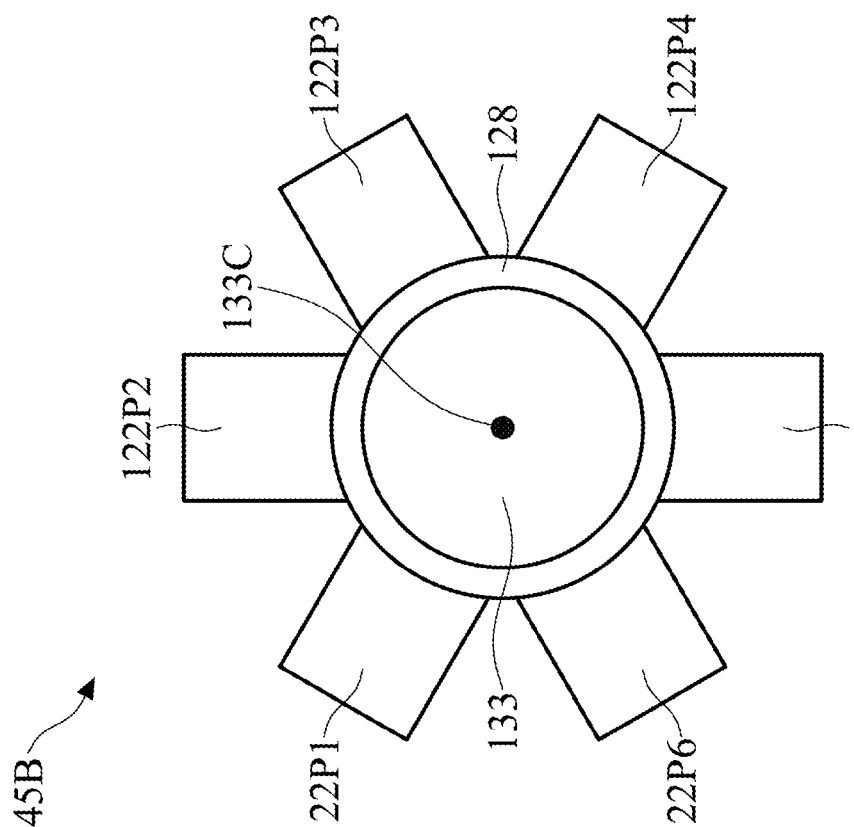
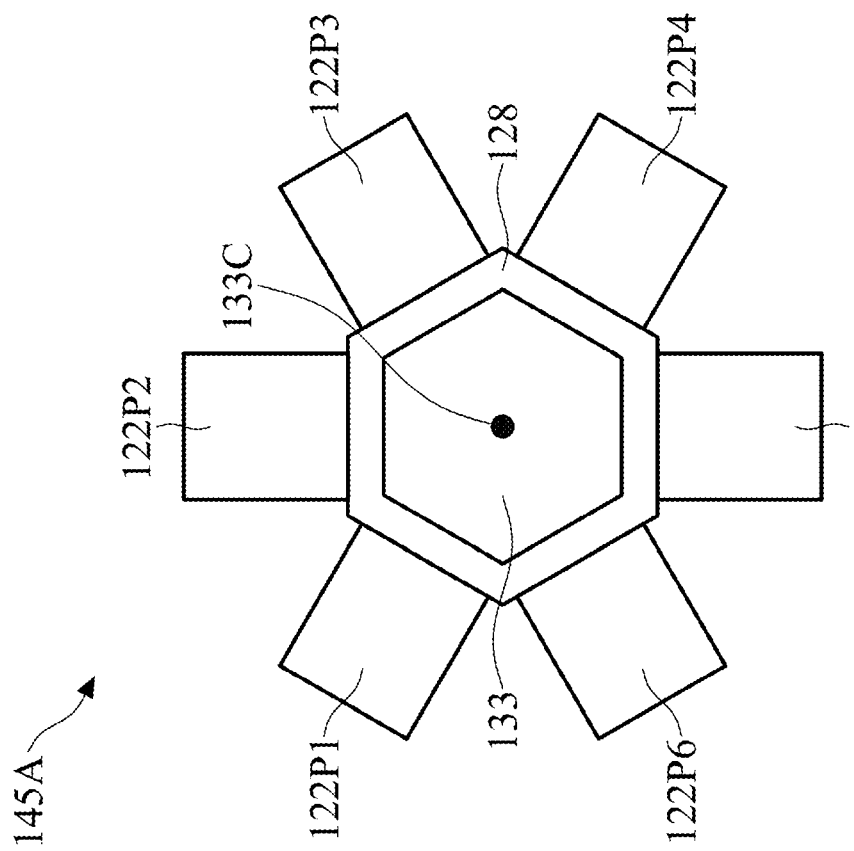

RESISTIVE RANDOM ACCESS MEMORY STRUCTURE AND METHOD FOR FORMING THE SAME

BACKGROUND

Field of the Disclosure

The present disclosure relates to a non-volatile memory structure, and in particular, it relates to a resistive random access memory structure.

Description of the Related Art

Many materials and apparatuses of new types of non-volatile memory devices are under development. New types of non-volatile memory devices include magnetic random access memory (MRAM) devices, phase change memory (PCM) devices, and resistive random access memory (RRAM) devices. Among these non-volatile memory devices, RRAM devices have many advantages, such as low power consumption, low operation voltages, short write and erase times, high reliability, long memory time, non-destructive read-out, multi-state memory, process simplicity, and only a small area is required. Therefore, further downscaling the area of the component in the RRAM and increasing the capacity of the memory is an urgent development goal in the industry.

SUMMARY

In some embodiments of the disclosure, an RRAM structure is provided. The RRAM structure includes a semiconductor substrate, a transistor, a bottom electrode, a plurality of top electrodes, and a resistive-switching layer. The transistor is disposed over the semiconductor substrate. The bottom electrode is disposed over the semiconductor substrate and is electrically connected to a drain region of the transistor. The plurality of top electrodes is disposed along a sidewall of the bottom electrode. The resistance-switching layer is disposed between the bottom electrode and the plurality of top electrodes.

In some embodiments of the disclosure, an RRAM structure is provided. The RRAM structure includes a semiconductor substrate, a multilayered metal layer, and a memory cell. The multilayered metal layer is disposed over the semiconductor substrate. The memory cell is disposed over the semiconductor substrate. The memory cell includes a bottom electrode, a plurality of top electrodes disposed along a sidewall of the bottom electrode, and a resistance-switching layer disposed between the plurality of top electrodes and the bottom electrode. The top electrodes are electrically connected to at least two layers of the multilayered metal layer.

In some embodiments of the disclosure, a method for forming an RRAM structure is provided. The method includes providing a semiconductor substrate, forming an IMD layer over the semiconductor substrate, forming a bottom electrode over the IMD layer, forming a resistance-switching layer surrounding the bottom electrode, and forming a plurality of top electrodes along a sidewall of the bottom electrode. The resistance-switching layer is between the bottom electrode and the plurality of top electrodes.

BRIEF DESCRIPTION OF THE DRAWINGS

The present disclosure can be further understood by reading the subsequent detailed description and examples with references made to the accompanying drawings, wherein:

FIGS. 2A, 2C, 2E, 2G, 2I, 2K, 2M, 2O illustrate top views at various stages of forming an RRAM structure in accordance with some embodiments of the present disclosure; FIGS. 2B, 2D, 2F, 2H, 2J, 2L, 2N, 2P illustrate cross-sectional views along line I-I in FIGS. 2A, 2C, 2E, 2G, 2I, 2K, 2M, 2O.

FIGS. 3A, 3C, 3E, 3G, 3I, 3K, 3M, 3O illustrate top views at various stages of forming an RRAM structure in accordance with some embodiments of the present disclosure; FIGS. 3B, 3D, 3F, 3H, 3J, 3L, 3N, 3P illustrate cross-sectional views along line I-I in FIGS. 3A, 3C, 3E, 3G, 3I, 3K, 3M, 3O.

FIGS. 4A and 4B are top views of memory cells in accordance with some embodiments of the present disclosure.

DETAILED DESCRIPTION

The present disclosure is described in detail with reference to the figures of the embodiments of the present disclosure. It should be appreciated, however, that the present disclosure can be embodied in a wide variety of implements and is not limited to embodiments described in the disclosure. Various features may be arbitrarily drawn at different scales for the sake of simplicity and clarity. Throughout the various views and illustrative embodiments, like reference numbers are used to designate like elements.

Figure 1:
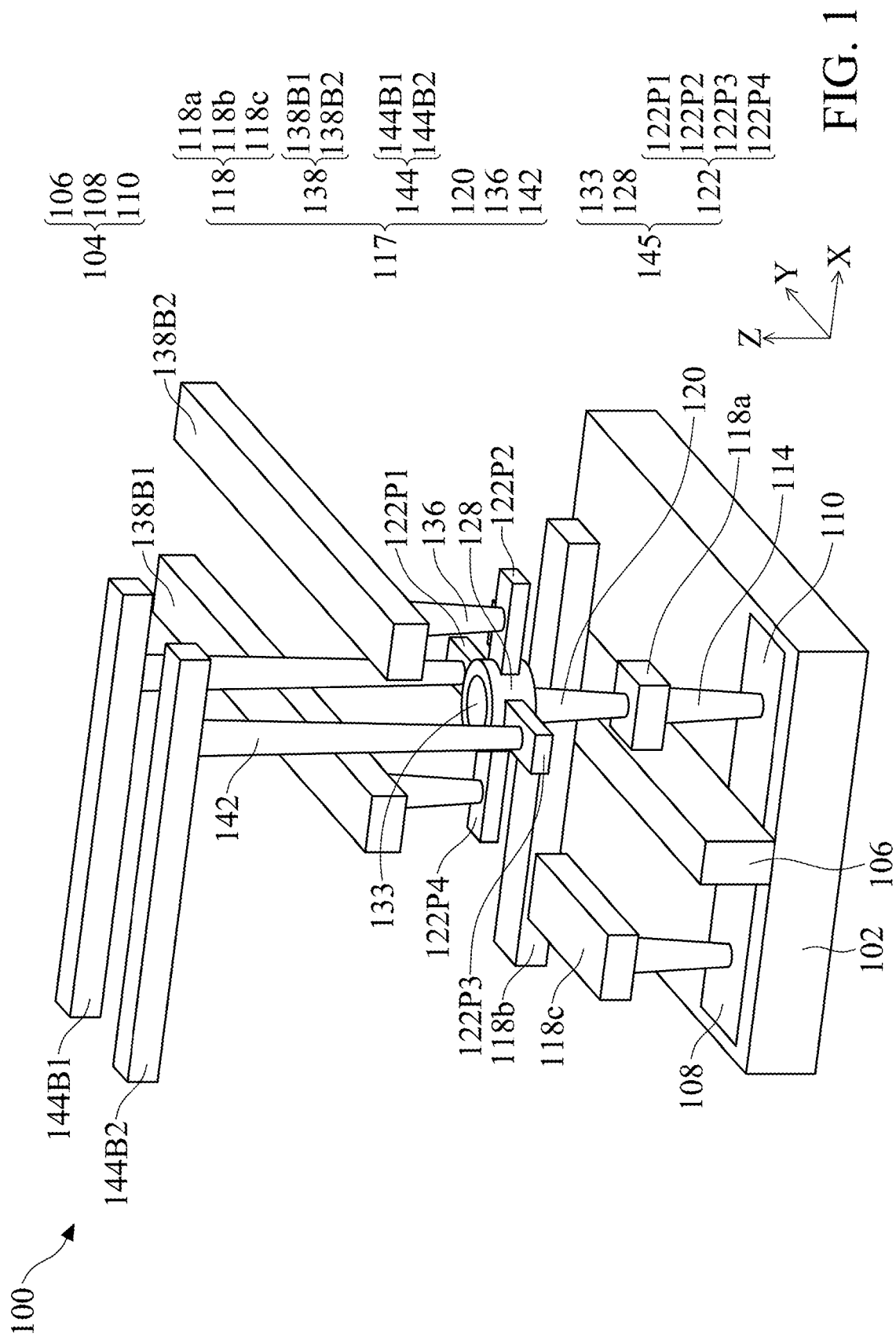
FIG. 1 is a three-dimensional view illustrating an RRAM structure in accordance with some embodiments of the present disclosure.

Referring to FIG. 1, which is a three-dimensional view illustrating an RRAM structure 100 in accordance with some embodiments of the present disclosure. In some embodiments, the RRAM structure 100 includes a semiconductor substrate 102, a transistor 104, contacts 114, an interconnect structure 117, and a memory cell 145. For the sake of simplicity and clarity, FIG. 1 only shows the above features, and remaining features are shown in cross-sectional views of FIG. 2O, 2P, 3O or 3P.

In some embodiments, the transistor 104 is disposed over the semiconductor substrate 102. The transistor 104 includes a gate structure 106 disposed over the upper surface of the semiconductor substrate 102, and a source region 106 and a drain region 108 disposed in the semiconductor substrate 102. The source region 106 and the drain region 108 are disposed on the opposite sides of the gate structure 106. In some embodiments, the gate structure 106 extends in the Y direction. In the embodiments shown in FIG. 1, the X direction and the Y direction are horizontal directions and the Z direction is a vertical direction. The X direction is not parallel to the Y direction. In an embodiment, the X direction is perpendicular to the Y direction.

In some embodiments, the interconnect structure 117 is disposed over the semiconductor structure 102. The interconnect structure 117 includes multiple metal layers 118, 138 and 144, and vias 120, 136 and 142.

In some embodiments, the first metal layer 118 includes metal lines 118a, 118b, and 118c. The metal line 118b is a source line and is electrically connected to the source region 108 of the transistor 106. In some embodiments, the metal line 118b extends in the X direction and the metal line 118c extends in the Y direction.

The memory cell 145 is disposed over the semiconductor substrate 102 and disposed between the first metal layer 118 and the second metal layer 138. In some embodiments, the memory cell 145 includes a bottom electrode 133, a plurality of top electrodes 122, and a resistance-switching layer 128 disposed between the bottom electrode 133 and the plurality of top electrodes 122. The resistance-switching layer 128 surrounds the bottom electrode 133. In some embodiments, the bottom electrode 133 is electrically connected to the drain region 110 of the transistor 106 through the via 120, the metal line 118a and the contact 114.

In some embodiments, the plurality of top electrodes 122 includes a first top electrode 122P1, a second top electrode 122P2, the third top electrode 122P3, and the fourth top electrode 122P4. The top electrodes 122P1, 122P2, 122P3, 122P4 are separated from each other. The top electrodes 122P1, 122P2, 122P3, 122P4 are laterally disposed along the sidewall of the bottom electrode 133 to arrange into a ring shape. In some embodiments, the top electrodes 122P1, 122P2, 122P3, 122 P4 each have a strip shape.

In some embodiments, the first top electrode 122P1 and the third top electrode 122P3 extend in the Y direction. The first top electrode 122P1 and the third top electrode 122P3 are disposed opposite to each other with respect to the bottom electrode 133. The first top electrode 122P1 and the third top electrode 122P3 are electrically connected to two bit lines 144B1 and 144B2 of the third metal layer 144 respectively through the vias 142. The bit lines 144B1 and 144B2 extend in the X direction.

In some embodiments, the second top electrode 122P2 and the fourth top electrode 122P4 extend in the X direction. The second top electrode 122P2 and the fourth top electrode 122P4 are disposed opposite to each other with respect to the bottom electrode 133. The second top electrode 122P2 and the fourth top electrode 122P4 are electrically connected to two bit lines 138B2 and 138B2 of the second metal layer 138 respectively through the vias 136. The bit lines 138B2 and 138B2 extend in the Y direction.

In the embodiments shown in FIG. 1, four top electrodes 122 are disposed along the sidewall of the bottom electrode 133 so that the RRAM structure 100 can be realized as 1T4R structure. In some embodiments, the number of top electrodes disposed along the sidewall of the bottom electrode 133 may be greater than four.

For example, referring to FIGS. 4A and 4B, which are top views of memory cells 145A and 145B in accordance with some embodiments of the present disclosure. Six top electrodes 122 are arranged annularly along the sidewall of the bottom electrode 133. In some embodiments, the top electrodes 122P1, 122P2, 122P3, 122P4, 122P5, 122P6 have rotational symmetry with one another about a rotation axis passing through the center of the bottom electrode 133.

In the embodiments shown in FIG. 4A, when viewed from a top view, the bottom electrode 133 has a hexagonal shape. In the embodiments shown in FIG. 4B, the bottom electrode 133 has a round shape. In some embodiments, the shape of the bottom electrode 133 may depend on design requirements or etching process capability limitation.

In some embodiments, the first top electrode 122P1 and the fourth top electrode 122P4 are disposed opposite to each other and are electrically connected to the two bit lines of the second metal layer (not shown); the second top electrode 122P2 and the fifth top electrode 122P5 are disposed opposite to each other and are electrically connected to the two bit lines of the third metal layer (not shown); the third top electrode 122P3 and the six top electrode 122P6 are disposed opposite to each other and are electrically connected to the two bit lines of the fourth metal layer (not shown).

In the embodiments of the present disclosure, the RRAM structure 100 includes a plurality of top electrodes 122 disposed along the sidewall of the bottom electrode 133 thereby realizing 1TnR (wherein n is equal to or greater than four) structure. As a result, the storage capacity per unit area of the RRAM structure can be increased. In addition, the top electrodes are electrically connected to at least two layers of the multilayered metal layer, thereby minimizing the used, area of the semiconductor substrate, which in turn increases the storage capacity per unit area of the RRAM structure. For example, the storage capacity of the 1T4R structure (i.e. four top electrodes) of the embodiments can be twice the storage capacity of the 1T1R structure (i.e. one top electrode).

The method tier forming the RRAM structure is described below in detail. FIGS. 2A, 2C, 2E, 2G, 2I, 2K, 2M, 2O illustrate top views at various stages of forming an RRAM structure in accordance with some embodiments of the present disclosure. FIGS. 2B, 2D, 2F, 2H, 2J, 2L, 2N, 2P illustrate cross-sectional views along line in FIGS. 2A, 2C, 2E, 2G, 2I, 2K, 2M, 2O.

Figure 2B:
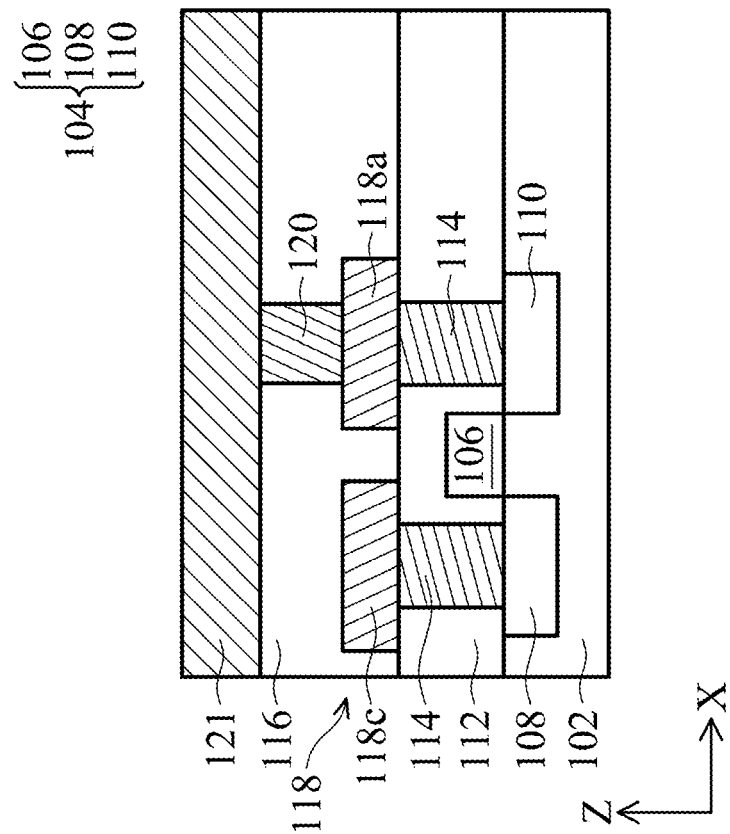
Figure 2A:
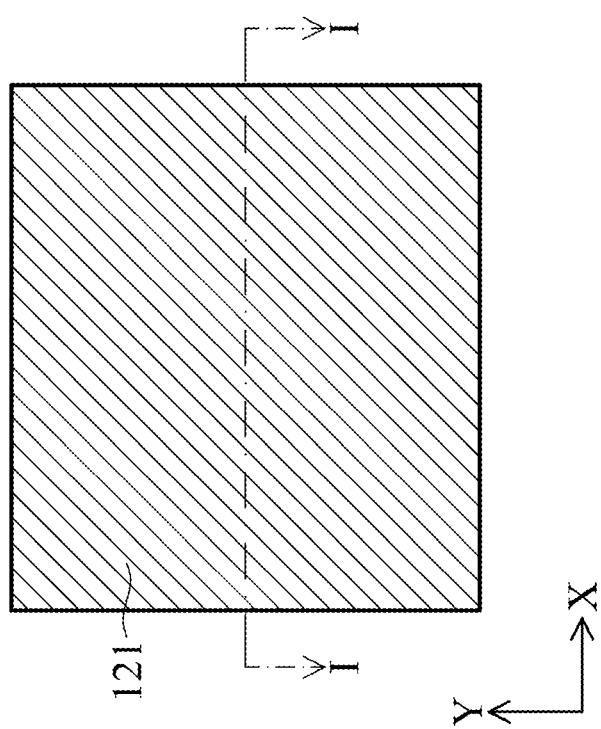

Referring to FIGS. 2A and 2B, a semiconductor substrate 102 is provided. In some embodiments, the semiconductor substrate 102 may be an elemental semiconductor substrate, such as a silicon substrate or a germanium substrate; a compound semiconductor substrate, such as a silicon carbide substrate or a gallium arsenide substrate. In some embodiments, the semiconductor substrate 102 may be a semiconductor-on-insulator (SOI) substrate.

In some embodiments, a transistor 104 is formed over the semiconductor substrate 102. The steps of forming the transistor 104 include forming a gate structure 106 over the semiconductor substrate 102, and forming a source region 108 and a drain region 110 in the semiconductor substrate 102. In some embodiments, the gate structure 106 may include a gate dielectric layer (not shown) formed on the upper surface of the semiconductor substrate 102, and a gate electrode layer (not shown) formed over the gate dielectric layer. In some embodiments, the gate dielectric layer is formed of silicon oxide, silicon nitride, silicon oxynitride, a high-k dielectric material, or a combination thereof. The gate electrode layer is formed of a conductive material such as polysilicon, metal, metal nitride, conductive metal oxide, or a combination thereof. In some embodiments, the source region 108 and the drain region 110 may be dopant.

Afterward, an interlayer dielectric (ILD) layer 112 is formed over the upper surface of the semiconductor substrate 102. The ILD layer 112 covers the transistor 104. In some embodiments, the ILD layer 112 is formed of silicon oxide, silicon nitride, silicon oxynitride, tetraethylorthosilicate (TEOS) oxide, phosphosilicate glass (PSG), borophosphosilicate glass (BPSG), fluoride-doped silicate glass (FSG), a low-k dielectric material, or a combination thereof.

Afterward, contacts 114 are formed in the ILD layer 112. The contacts 114 pass through the ILD layer 112 and land on the source region 108 and the drain region 110. In some embodiments, the contacts 114 are formed of a metal material (such as tungsten (W), aluminum (Al) or copper (Cu)), metal alloy, polysilicon, or a combination thereof. In some embodiments, the contacts 114 are formed by an etching process, a deposition process, and a planarization process.

Afterward, an inter-metal dielectric (IMD) layer 116 is formed over the upper surface of the ILD layer 112. In some embodiments, the IMD layer 116 is formed of silicon oxide, silicon nitride, silicon oxynitride, silicon carbide, silicon carbon nitride, silicon oxycarbide, spin-on-glass (SOG), multilayers thereof, or a combination thereof. The IMD layer 116 is formed by a deposition process (such as chemical vapor deposition (CVD)), spin-on coating process, or a combination thereof.

Afterward, a first metal layer 118 and vias 120 are formed in the IMD layer 116. The vias 120 are formed over the first metal layer 118. In some embodiments, the first metal layer 118 and the vias 120 are formed of a metal material, such as tungsten (W), nickel (Ni), titanium (Ti), tantalum (Ta), aluminum (Al), copper (Cu), titanium nitride, tantalum nitride, an alloy thereof, multilayers thereof, or a combination thereof. In some embodiments, the first metal layer 118 and vias 120 may be formed by a deposition process, an etching process, electroplating, single damascene or dual damascene process, or a combination thereof.

Afterward, a top electrode material 121 is formed over the upper surface of the IMD layer 116. In some embodiments, the top electrode material 121 is formed of titanium (Ti), titanium nitride (TiN), tantalum (Ta), tantalum nitride (TaN), platinum (Pt), tungsten (W), aluminum (Al), or a combination thereof. In some embodiments, the top electrode material 121 may be formed by physical vapor deposition (PVD), atomic layer deposition (ALD), metal organic chemical vapor deposition (MOCVD), or a combination thereof.

Figure 2D:
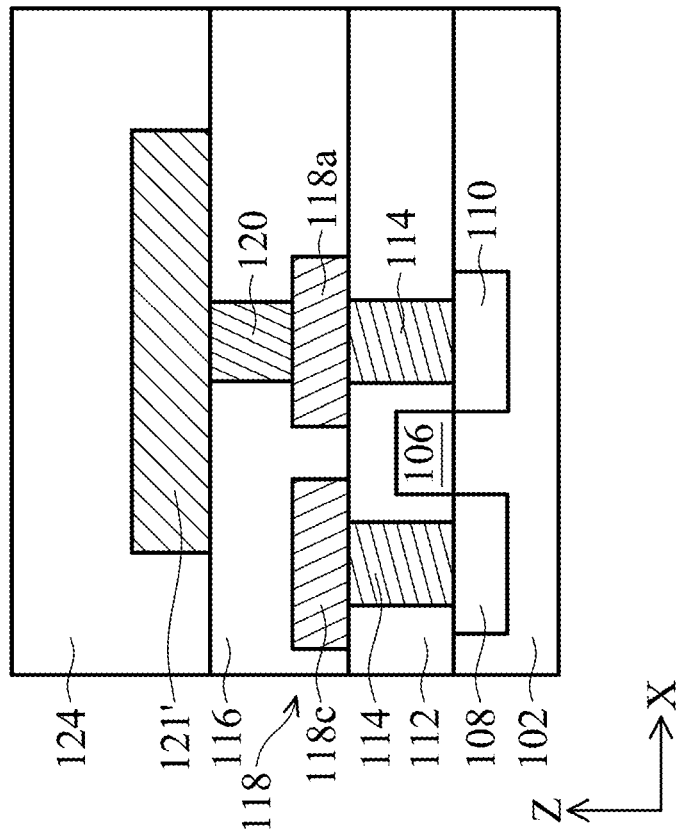
Figure 2C:
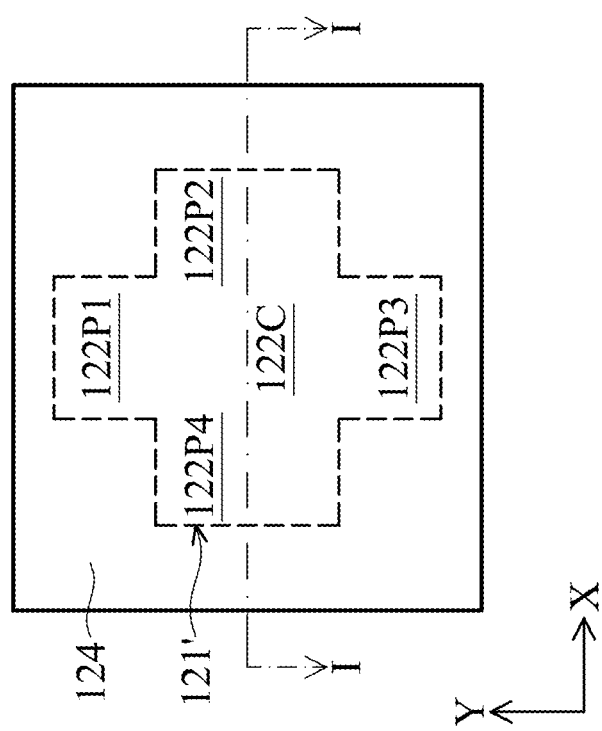

Referring to FIGS. 2C and 2D, the top electrode material 121 is patterned. The patterned top electrode material 121' includes a center portion 122C and a plurality of protruding portions 122P1, 122P2, 122P3, 122P4 connecting the center portion 122O. In some embodiments, the patterning process includes a photolithography process and an etching process.

Afterward, an IMD layer 124 is formed over the IMD layer 116. The IMD layer 124 covers the patterned top electrode material 121. In some embodiments, the material and formation method of the IMD layer 124 may be the same as or similar to that of the IMD layer 116.

Figures 2E, 2F:
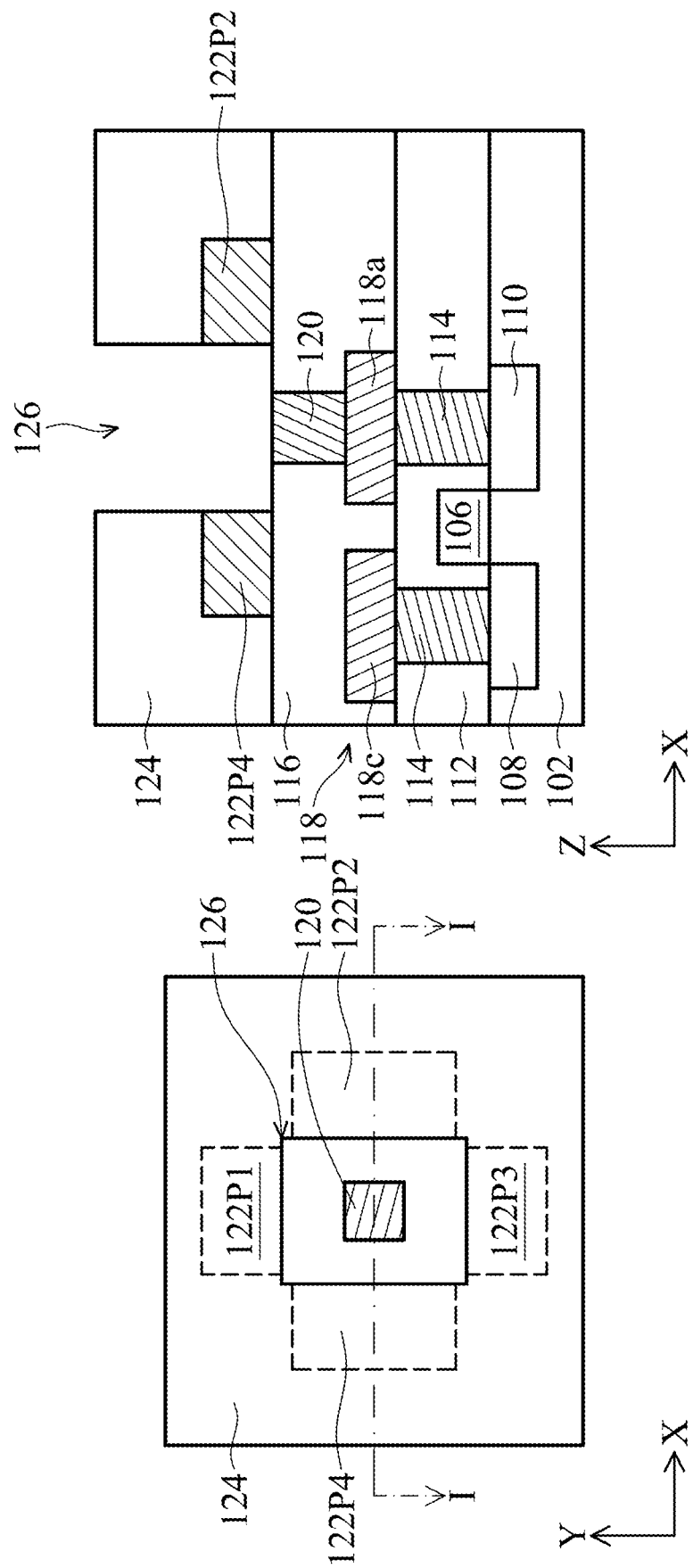

Referring to FIGS. 2E and 2F, the IMD layer 124 and the top electrode material 121' are patterned. The patterning process removes the center portion 122O of the top electrode material 121' to form an opening 126. The protruding portions 122P1, 122P2, 122P3, 122P4 are remained unremoved to function as the top electrodes.

In some embodiments, the opening 126 exposes the IMD layer 116 and the via 120. The top electrodes 122P1, 122P2, 122P3, 122P4 are separated from each other by the opening 126. In the embodiments shown in FIG. 2E, the opening 126 has a rectangular shape. In some other embodiments, the opening 126 may have other shapes such as a polygonal shape or a round shape.

Figures 2G, 2H:
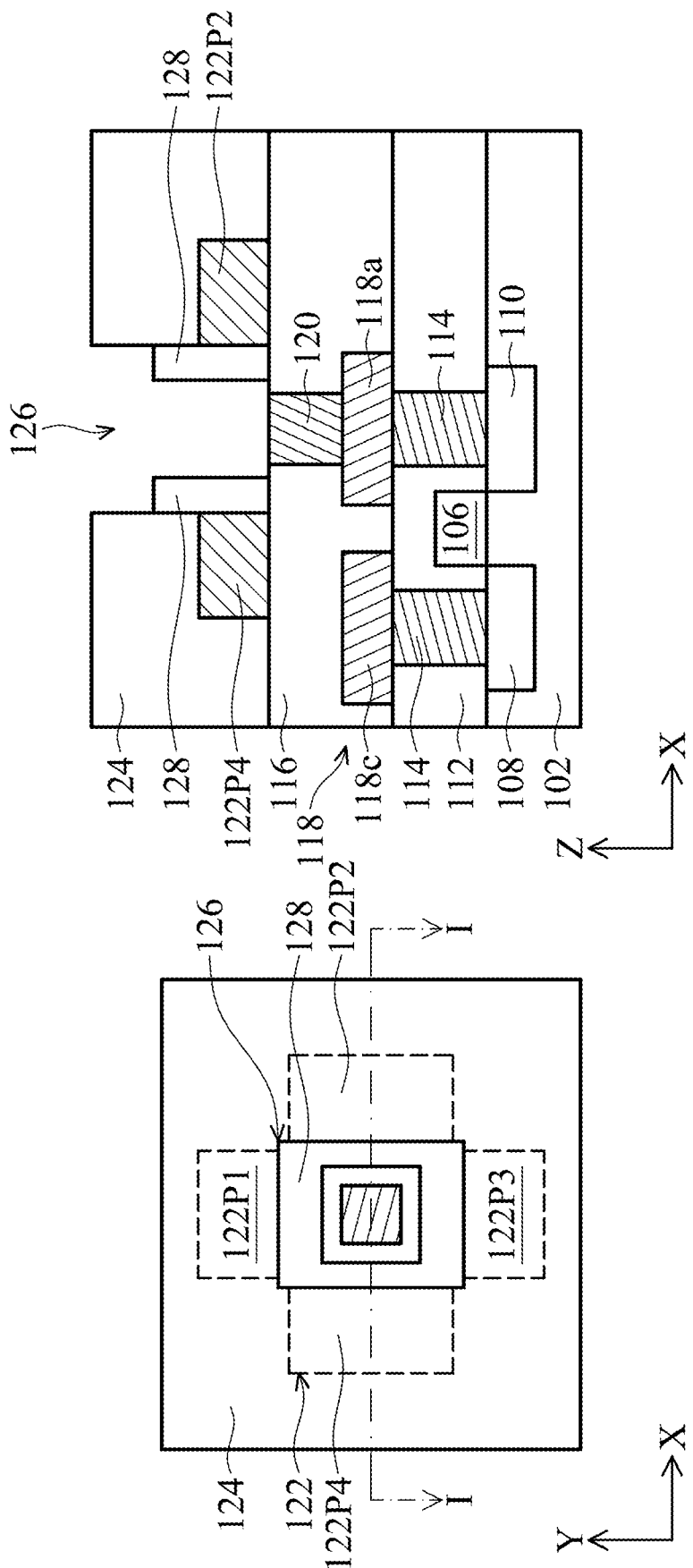

Referring to FIGS. 2G and 2H, a resistance-switching layer 128 are formed along the sidewall of the opening 126. In some embodiments, the resistance-switching layer 128 contacts respective sidewalls of the top electrodes 122P1, 122P2, 122P3, 122P4. In some embodiments, the resistance-switching layer 128 is formed of transition metal oxide, such as $Ta_2O_5$, $HfO_2$, $HfSiO_x$, $Al_2O_3$, $InO_2$, $La_2O_3$, $ZrO_2$, $TiO_2$, or a combination thereof. The steps of forming the resistance-switching layer 128 include conformally forming a transition metal oxide along the upper surface of the IMD layer 124 and the sidewall and the bottom surface of the opening 126. Afterward, an etching process is performed to remove portions of the transition metal oxide along the upper surface of the IMD layer 124 and the bottom surface of the opening 126. After the etching process, the resistance-switching layer 128 may have an upper surface below the upper surface of the IMD layer 124.

Figures 2I, 2J:
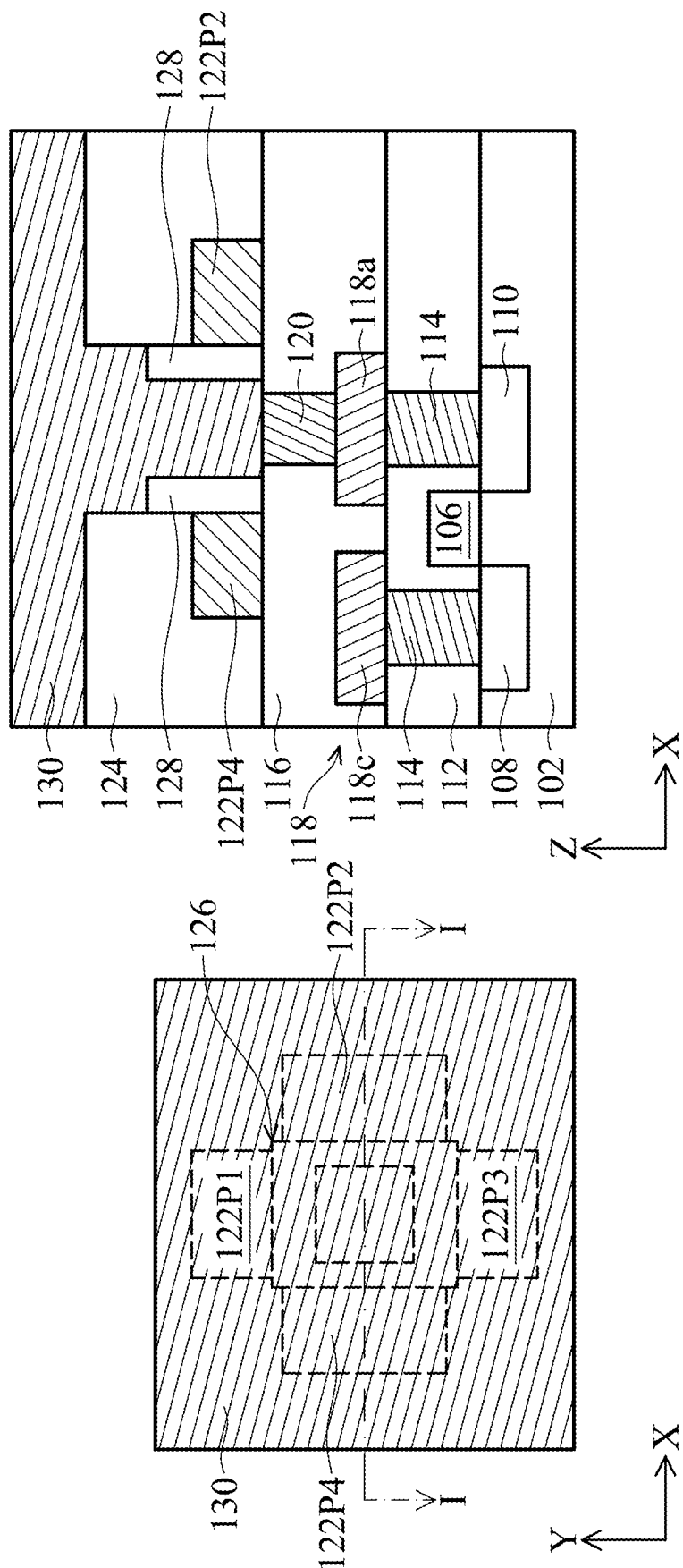

Referring to FIGS. 2I and 2J, a bottom electrode material 130 is formed over the upper surface of the IMD layer 124 and is filled into a remaining portion of the opening 126. In some embodiments, the bottom electrode material 130 is formed of titanium (Ti), titanium nitride (TiN), tantalum (Ta), tantalum nitride (TaN), platinum (Pt), tungsten (W), aluminum (Al), or a combination thereof. In some embodiments, the bottom electrode material 130 may be formed by PVD, ALD, MOCVD, or a combination thereof.

Figures 2K, 2L:
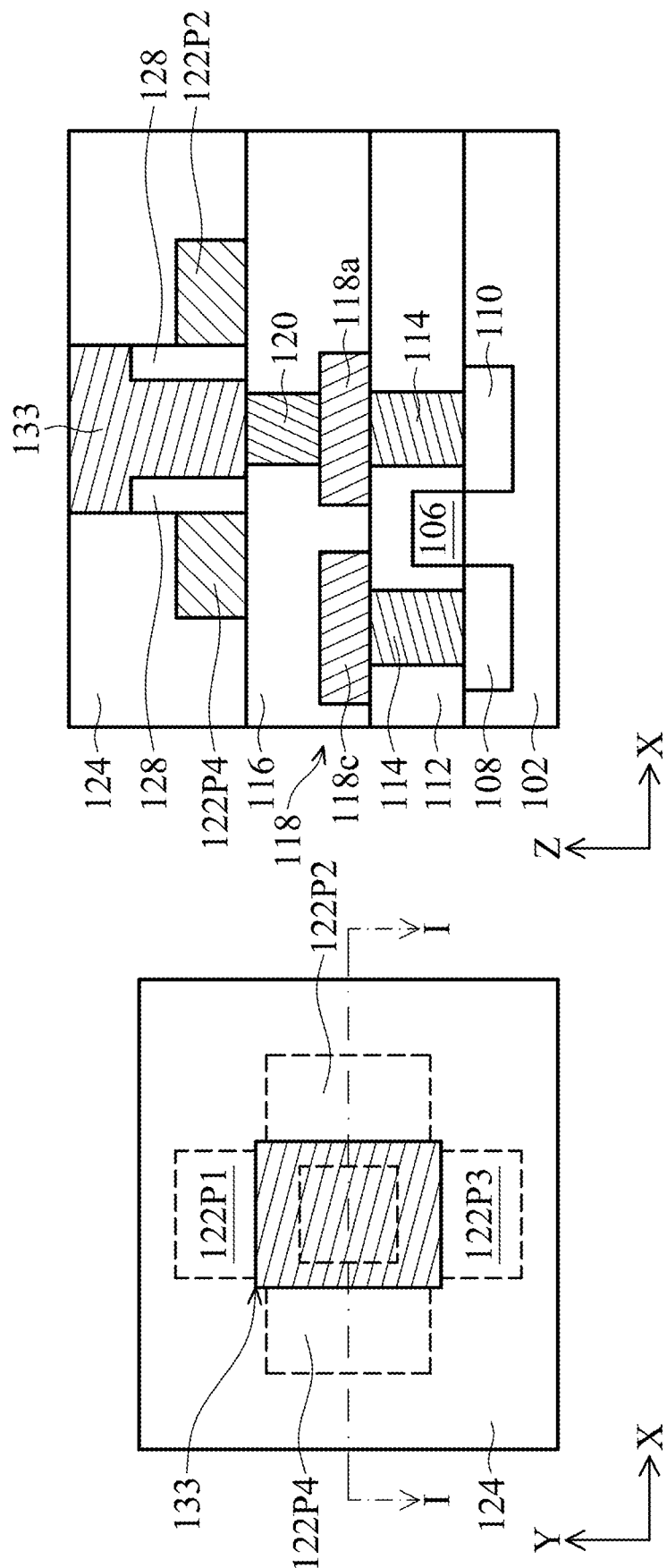

Referring to FIGS. 2K and 2L, the portion of the bottom electrode material 130 covering the IMD layer 124 is removed to expose the upper surface of the IMD layer 124. After the removal process, a bottom electrode 133 is formed in the opening 126. In some embodiments, the upper surface of the bottom electrode 133 is coplanar with the upper surface of the IMD layer 124. In some embodiments, the bottom electrode 133 includes an upper portion covering the upper surface of the resistance-switching layer 128, and a lower portion surrounded by the resistance-switching layer 128. In some embodiments, the removal process may be a chemical mechanical polishing (CMP) process or an etch-back process.

Referring to FIGS. 2M and 2N, an IMD layer 134 is formed over the IMD layer 124. The IMD layer 134 covers the bottom electrode 133. In some embodiments, the material and formation method of the IMD layer 134 may be the same as or similar to that of the IMD layer 116.

In some embodiments, vias 136 are formed to pass through the IMD layer 124 and the IMD layer 134 and land on the second top electrode 122P2 and the fourth top electrode 122P4. A second metal layer 138 is formed in the IMD layer 134 and over the vias 136. The second metal layer 138 includes a bit line 138B1 and a bit line 138B2. In some embodiments, the bit lines 138B1 and 138B2 of the second metal layer 138 extend in the Y direction. The bit lines 138B2 and 138B1 are electrically connected to the second top electrode 122P2 and the fourth top electrode 122P4 respectively. In some embodiments, the materials and formation methods of the vias 136 and the second metal layer 138 may be the same as or similar to those of the vias 120 and the first metal layer 118.

Figures 2O, 2P:
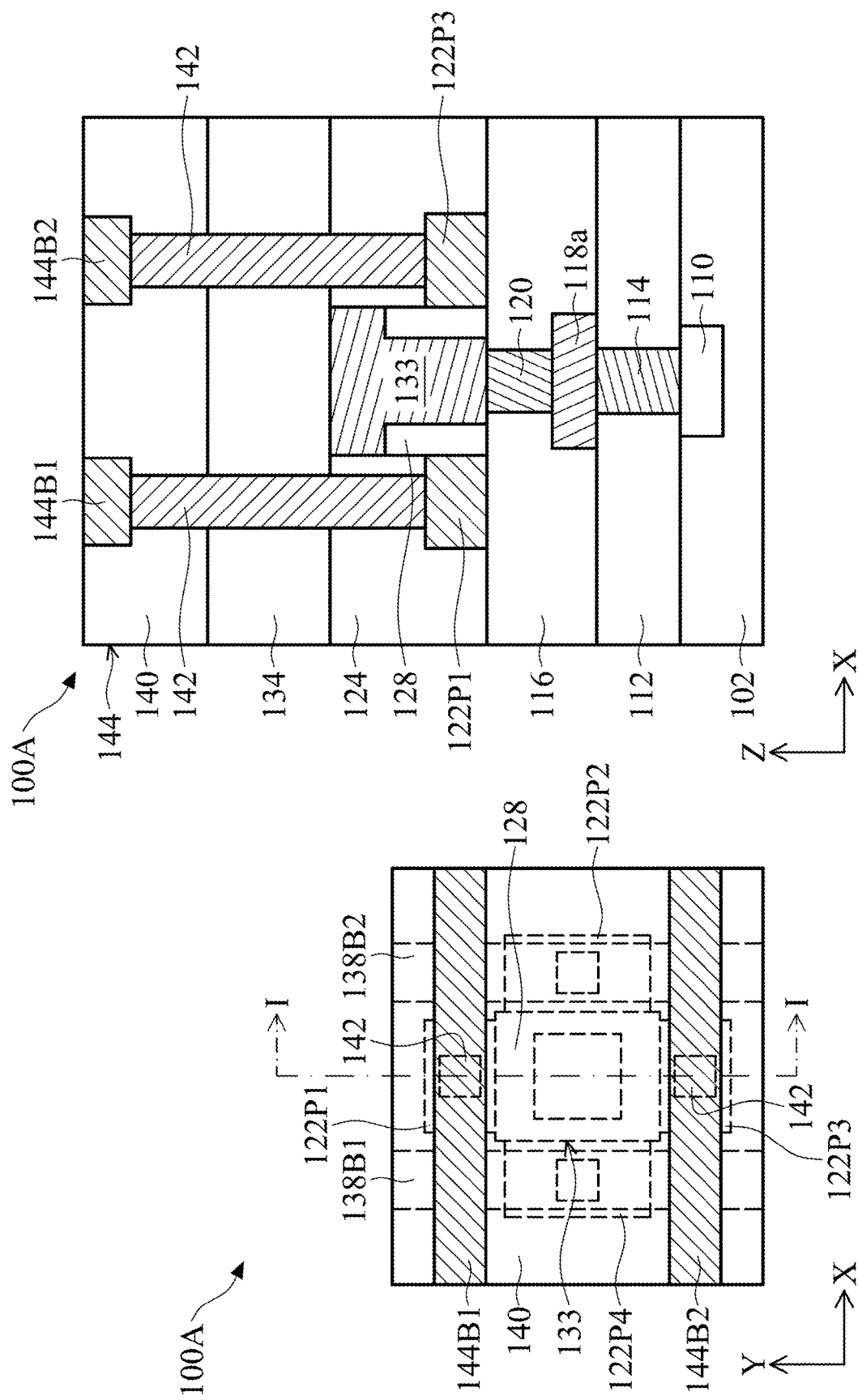

Referring to FIGS. 2O and 2P, an MID layer 140 is formed over the IMD layer 134. The IMD layer 140 covers the second metal layer 138. In some embodiments, the material and formation method of the IMD layer 140 may be the same as or similar to that of the IMD layer 116.

In some embodiments, vias 142 are formed to pass through the IMD layers 124, 134 and 140 and land on the first top electrode 122P1 and the third top electrode 122P3. A third metal layer 144 is formed in the IMD layer 140 and over the vias 142. The third metal layer 144 includes a bit line 144B1 and a bit line 144B2. In some embodiments, the bit lines 144B1 and 144B2 of the third metal layer 144 extend in the X direction. The bit lines 144B1 and 144B2 are electrically connected to the first top electrode 122P1 and the third top electrode 122P3 respectively. In some embodiments, the materials and the formation methods of the vias 142 and the third metal layer 144 may be the same as or similar to those of the vias 120 and the first metal layer 118. After forming the vias 142 and the third metal layer 144, an RRAM structure 100A is provided.

FIGS. 3A, 3C, 3E, 3G, 3I, 3K, 3M, 3O illustrate top views at various stages of forming an RRAM structure 100B in accordance with some embodiments of the present disclosure. FIGS. 3B, 3D, 3F, 3H, 3J, 3L, 3N, 3P illustrate cross-sectional views along line I-I in FIGS. 3A, 3C, 3E, 3G, 3I, 3K, 3M, 3O. Elements in FIGS. 3A through 3P that are the same as those in FIGS. 2A through 2P are labeled with the same reference numbers as in FIGS. 2A through 2P and are not described again for brevity. In the embodiments shown in FIGS. 2A through 2P, the bottom electrode is formed after forming the plurality of top electrodes. In the embodiments shown in FIGS. 3A through 3P, the bottom electrode is formed before the plurality of top electrodes.

Referring to FIGS. 3A and 3B, a bottom electrode material 130 (not shown) is formed over the upper surface of the IMD layer 116. Afterward, the bottom electrode material 130 is patterned to form a bottom electrode 133 over the via 120.

Referring to FIGS. 3C and 3D, a resistance-switching layer 128 is formed along the sidewall of the bottom electrode 133. The resistance-switching layer 128 surrounds the bottom electrode 133. The resistance-switching layer 128 may be formed by conformally depositing a transition metal oxide along the upper surface of the IMD layer 116 and the sidewall and the upper surface of the bottom electrode 133. Afterward, an etching process is performed to remove portions of the transition metal oxide along the upper surface of the IMD layer 116 and the upper surface of the bottom electrode 133. After the etching process, the resistance-switching layer 128 has the upper surface below the upper surface of the bottom electrode 133.

Figure 3F:
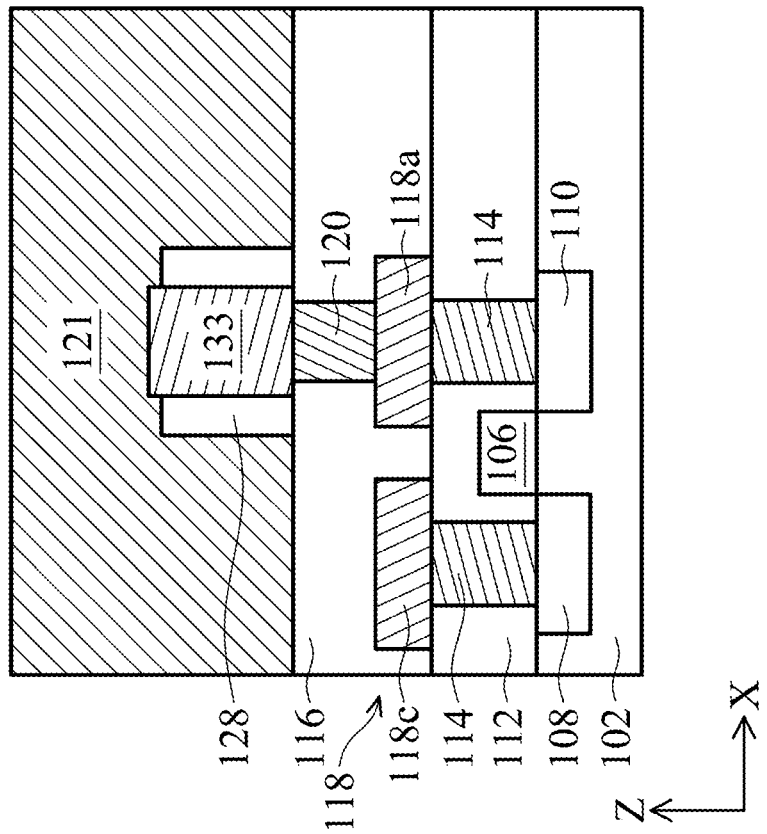
Figure 3E:
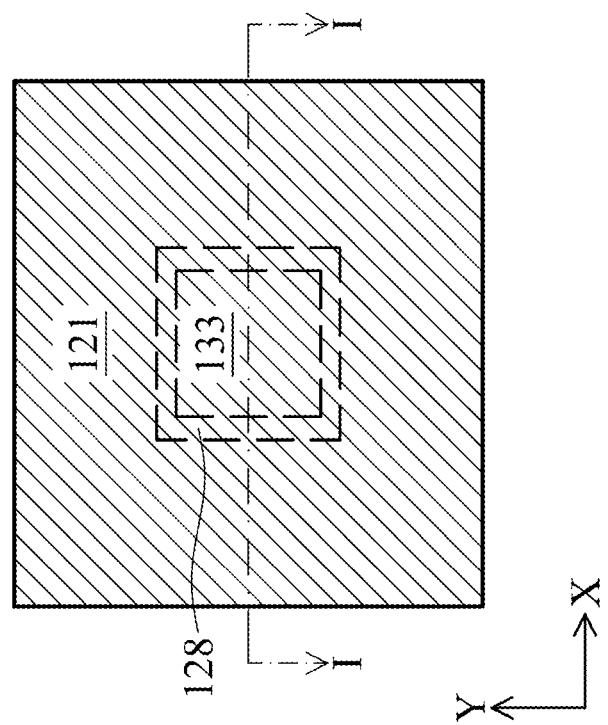

Referring to FIGS. 3E and 3F, a top electrode material 121 is formed over the IMD layer 116 and covers the resistance-switching layer 128 and the bottom electrode 133.

Figures 3G, 3H:
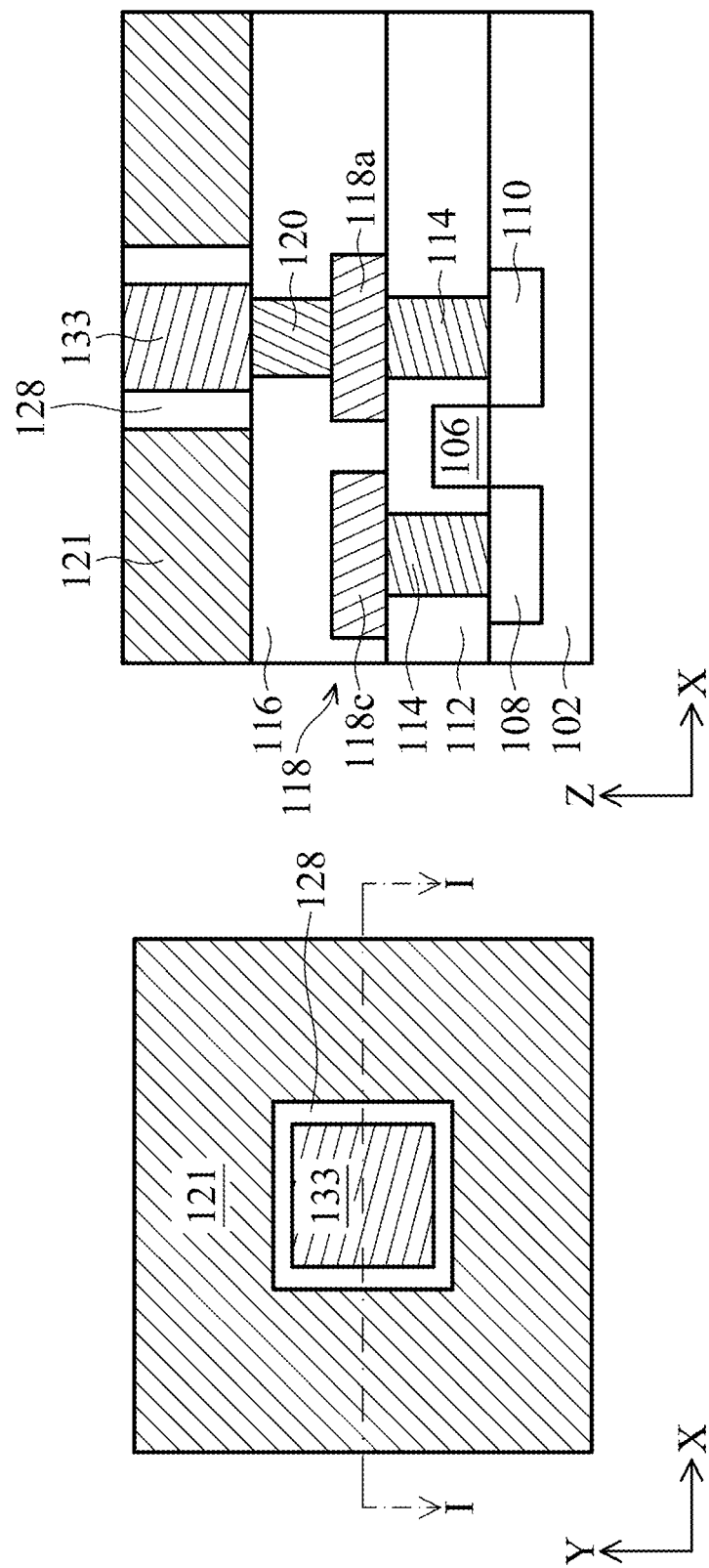

Referring to FIGS. 3G and 3H, portions of the top electrode material 121 covering the resistance-switching layer 128 and the bottom electrode 133 are removed. In some embodiments, the removal process may be CMP or an etch-back process.

Figures 3I, 3J:
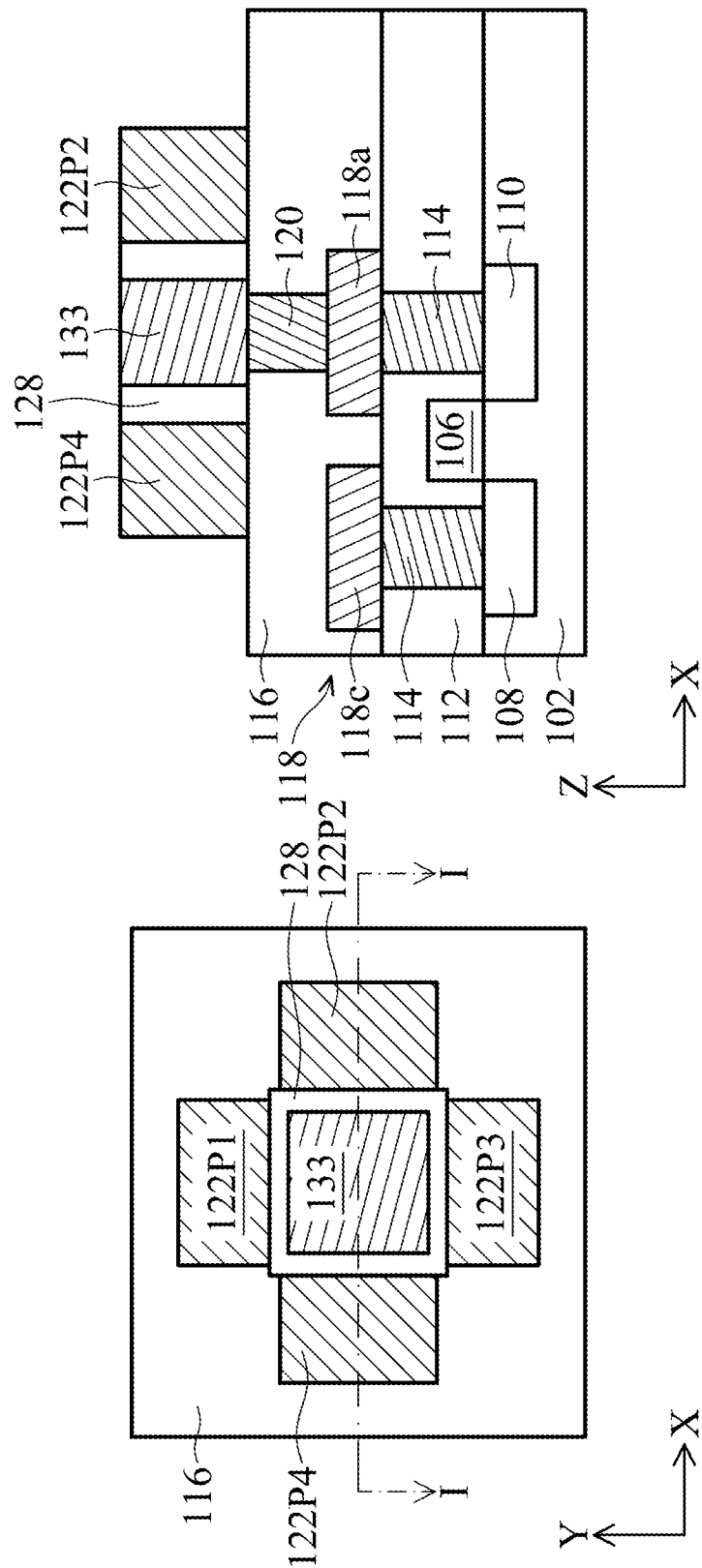

Referring to FIGS. 3I and 3J, the top electrode material 121 is patterned to form a plurality of top electrodes 122P1, 122P2, 122P3, 122P4 along the sidewall of the bottom electrode 133.

Referring to FIGS. 3K and 3L, an IMD layer 124 is formed over the IMD layer 116. The IMD layer 124 covers the bottom electrode 133, the resistance-switching layer 128, and the top electrodes 122P1, 122P2, 122P3, 122P4.

Figures 3M, 3N:
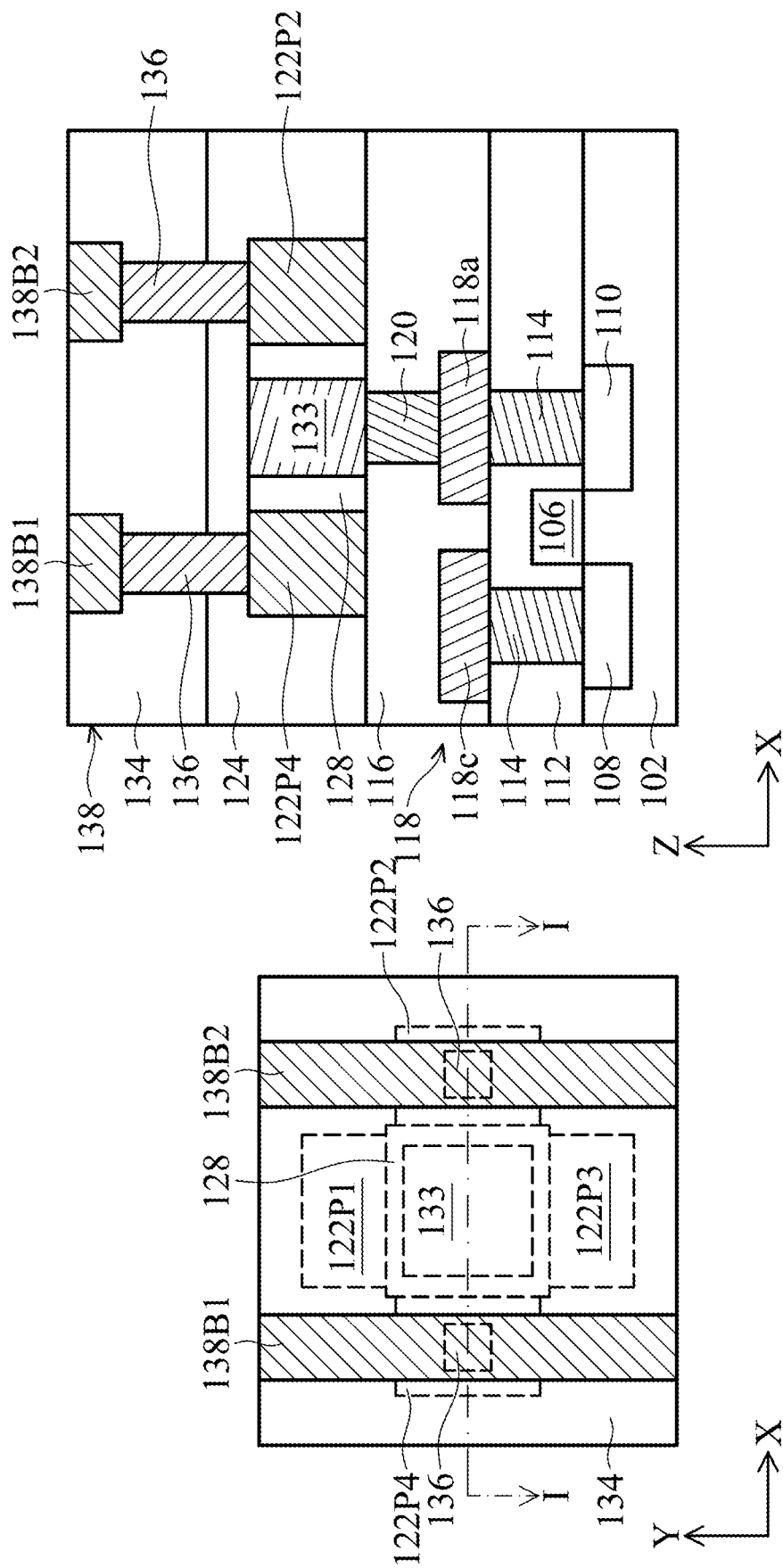

Referring to FIGS. 3M and 3N, an IMD layer 134 is formed over the IMD layer 124. Afterward, vias 136 are formed to pass through the IMD layer 124 and the IMD layer 134 and land on the second top electrode 122P2 and the fourth top electrode 122P4. A second metal layer 138 is formed in the IMD layer 134 and over the vias 136. In some embodiments, bit lines 138B1 and 138B2 of the second metal layer 138 extend in the Y direction. The bit lines 138B2 and 13801 are electrically connected to the second top electrode 122P2 and the fourth top electrode 122P4 respectively.

Figures 3O, 3P:
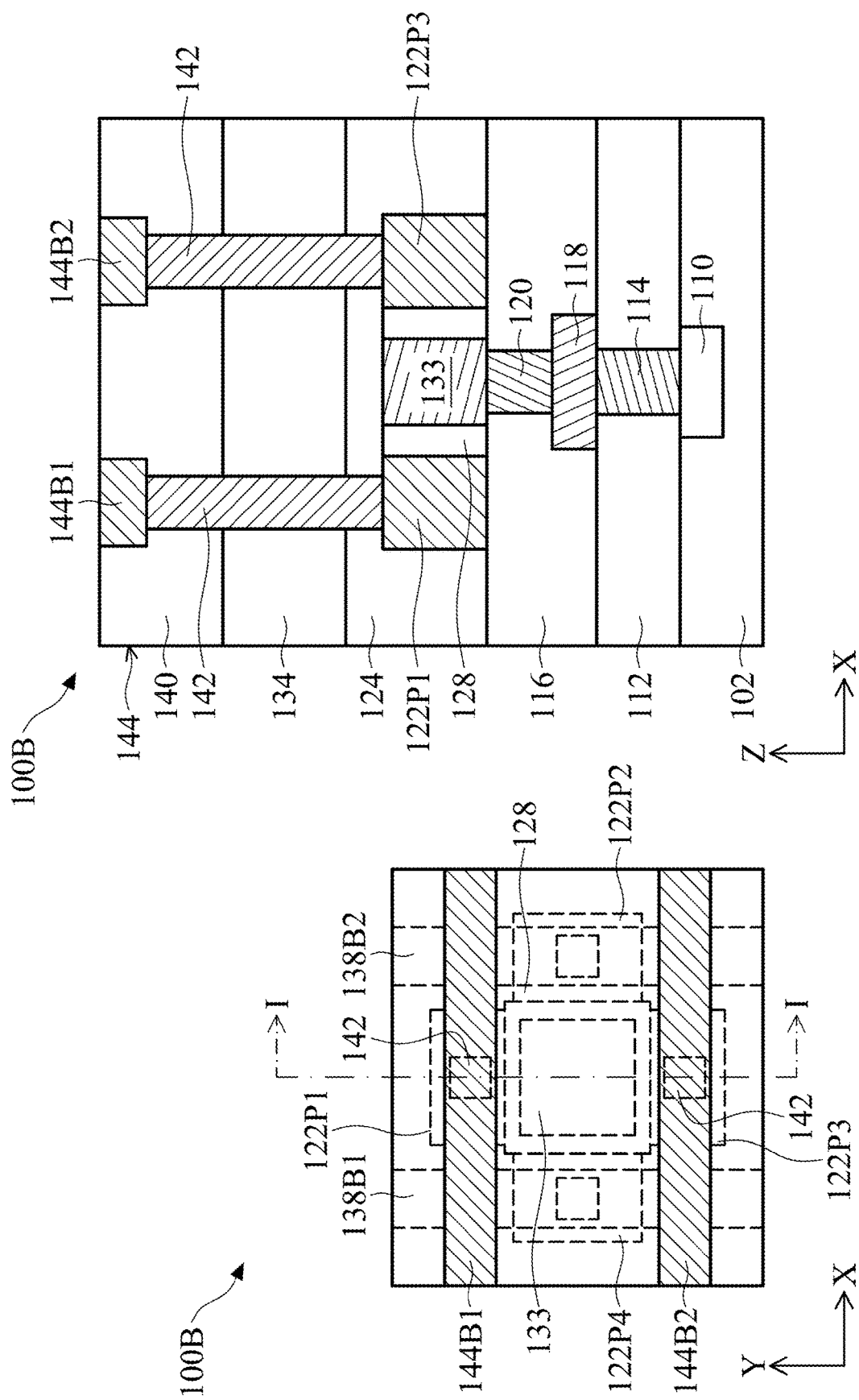

Referring to FIGS. 3O and 3P, an IMD layer 140 is formed over the IMD layer 134. Afterward, vias 142 are formed to pass through the IMD layer 124, 134 and 140 and land on the first top electrode 122P1 and the third top electrode 122P3. A third metal layer 144 is formed in the IMD layer 140 and over the vias 142. In some embodiments, bit lines 144B1 and 144B2 of the third metal layer 144 extend in the X direction. The bit lines 144B1 and 144P2 are electrically connected to the first top electrode 122P1 and the third top electrode 122P3 respectively. After forming the vias 142 and the third metal layer 144, an RRAM structure 100B is provided.

In summary, the RRAM structure of the embodiments of the present disclosure includes a plurality of top electrodes disposed along the sidewall of the bottom electrode thereby realizing 1TnR (wherein n is equal to or greater than four) structure. As a result, the storage capacity per unit area of the RRAM structure can be increased.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A resistive random access memory (RRAM) structure, comprising:
    a semiconductor substrate;
    a transistor disposed over the semiconductor substrate;
    a bottom electrode disposed over the semiconductor substrate, wherein the bottom electrode is electrically connected to a drain region of the transistor;
    a plurality of top electrodes disposed along a sidewall of the bottom electrode, wherein the plurality of top electrodes extend radially from the bottom electrode on a same plane; and
    a resistance-switching layer disposed between the plurality of top electrodes and the bottom electrode.

2. The RRAM structure as claimed in claim 1, wherein the plurality of top electrodes comprises a first top electrode, a second top electrode, a third top electrode, and a fourth top electrode.

3. The RRAM structure as claimed in claim 2, wherein the first top electrode and the third top electrode are disposed opposite to each other in a first direction, and the second top electrode and the fourth top electrode are disposed opposite to each other in a second direction that is not parallel to the first direction.

4. The RRAM structure as claimed in claim 2, further comprising:
    a first metal layer disposed over the bottom electrode, the resistance-switching layer, and the plurality of top electrodes, wherein the second top electrode and the fourth top electrode are electrically connected to two bit lines of the first metal layer respectively; and
    a second metal layer disposed over the first metal layer, wherein the first top electrode and the third top electrode are electrically connected to two bit lines of the second metal layer respectively.

5. The RRAM structure as claimed in claim 4, wherein the two bit lines of the first metal layer extend in a first direction, and the two bit lines of the second metal layer extend in a second direction that is not parallel to the first direction.

6. The RRAM structure as claimed in claim 1, wherein the bottom electrode covers an upper surface of the resistance-switching layer.

7. The RRAM structure as claimed in claim 1, wherein an upper surface of the bottom electrode, an upper surface of the resistance-switching layer, and respective upper surfaces of the top electrodes are coplanar.

8. A resistive random access memory (RRAM) structure, comprising:
    a semiconductor substrate;
    multiple metal layers disposed over the semiconductor substrate; and
    a memory cell disposed over the semiconductor substrate, comprising:
    a bottom electrode;
    a plurality of top electrodes disposed along a sidewall of the bottom electrode; and
    a resistance-switching layer disposed between the plurality of top electrodes and the bottom electrode,
    wherein the top electrodes are electrically connected to at least two layers of the multiple metal layers.

9. The RRAM structure as claimed in claim 8, wherein the top electrodes have rotational symmetry with one another about a rotation axis passing through a center of the bottom electrode.

10. The RRAM structure as claimed in claim 8, wherein the top electrodes are arranged into a ring shape.

11. The RRAM structure as claimed in claim 8, wherein the number of top electrodes is equal to or greater than four.

12. The RRAM structure as claimed in claim 8, wherein the memory cell is disposed between a first layer and a second layer of the multiple metal layers.

13. The RRAM structure as claimed in claim 12, wherein the first layer of the multiple metal layers comprises a source line which is electrically connected to a source region in the semiconductor substrate.

14. The RRAM structure as claimed in claim 12, wherein:
two of the top electrodes are electrically connected to the second layer of the multiple metal layers, and
two of the top electrodes are electrically connected to a third layer of the multiple metal layers.

15. A method for forming a resistive random access memory (RRAM) structure, comprising:
providing a semiconductor substrate;
forming an IMD layer over the semiconductor substrate;
forming a bottom electrode over the IMD layer;
forming a resistance-switching layer surrounding the bottom electrode; and
forming a plurality of top electrodes along a sidewall of the bottom electrode, wherein the plurality of top electrodes extend radially from the bottom electrode on a same plane, wherein the resistance-switching layer is between the bottom electrode and the plurality of top electrodes.

16. The method for forming the RRAM structure as claimed in claim 15, wherein forming the plurality of top electrodes comprises:
forming a top electrode material over the IMD layer;
patterning the top electrode material so that the patterned top electrode material has a center portion and a plurality of protruding portions connecting the center portion; and
removing the center portion of the patterned top electrode material to form an opening thereby remaining the plurality of protruding portions of the patterned top electrode.

17. The method for forming the RRAM structure as claimed in claim 16, wherein:
the resistance-switching layer is formed along a sidewall of the opening,
the bottom electrode is filled into the opening.

18. The method for forming the RRAM structure as claimed in claim 15, wherein forming the plurality of top electrodes comprises:
forming a top electrode material over the IMD layer to cover the bottom electrode and the resistive-switching layer;
removing a portion of the top electrode material covering the bottom electrode and the resistive-switching layer; and
patterning the top electrode material.

19. The method for forming the RRAM structure as claimed in claim 15, further comprising:
forming a first metal layer over the bottom electrode, the resistive-switching layer, and the plurality of top electrodes, wherein two of the top electrodes are electrically connected to two bit lines of the first metal layer; and
forming a second metal layer over the first metal layer, wherein two of the top electrodes are electrically connected to two bit lines of the second metal layer.

20. The method for forming the RRAM structure as claimed in claim 19, wherein the two bit lines of the first metal layer and the two bit lines of the second metal layer extend in different directions.

* * * * *